United States Patent [19]

Chinju et al.

[11] Patent Number: 5,760,561
[45] Date of Patent: Jun. 2, 1998

[54] METHOD OF CONTROLLING A STAGE AND A SYSTEM SUCH AS AN EXPOSING APPARATUS USING THE SAME

[75] Inventors: Hideyuki Chinju, Atsugi; Kunitaka Ozawa, Isehara; Hirohisa Ohta, Kawasaki, all of Japan

[73] Assignee: Canon Kabushiki Kaisha, Tokyo, Japan

[21] Appl. No.: 717,802

[22] Filed: Sep. 24, 1996

Related U.S. Application Data

[63] Continuation of Ser. No. 277,485, Jul. 19, 1994, abandoned.

[30] Foreign Application Priority Data

Jul. 21, 1993 [JP] Japan .................. 5-180427

[51] Int. Cl.$^6$ .................................... G05B 11/18
[52] U.S. Cl. ............................... 318/593; 318/649
[58] Field of Search ........................ 318/590–595, 318/649

[56] References Cited

U.S. PATENT DOCUMENTS

| | | | |
|---|---|---|---|
| 4,602,540 | 7/1986 | Murofushi et al. | 318/593 X |
| 4,672,210 | 6/1987 | Armstrong et al. | 250/292.2 |
| 4,676,630 | 6/1987 | Matsushita et al. | |
| 4,748,477 | 5/1988 | Isohata et al. | |
| 4,749,867 | 6/1988 | Matsushita et al. | |
| 4,810,941 | 3/1989 | Ohishi et al. | 318/592 X |
| 4,843,293 | 6/1989 | Futami | 318/609 |
| 5,008,703 | 4/1991 | Kawakami et al. | |
| 5,112,133 | 5/1992 | Kurosawa et al. | |
| 5,142,156 | 8/1992 | Ozawa et al. | |
| 5,153,494 | 10/1992 | Hollis, Jr. | 318/640 |
| 5,182,615 | 1/1993 | Kurosawa et al. | |
| 5,231,291 | 7/1993 | Amemiya et al. | |
| 5,262,707 | 11/1993 | Okazaki et al. | 318/592 |
| 5,315,526 | 5/1994 | Maeda et al. | 364/474.28 |
| 5,365,342 | 11/1994 | Ayata et al. | 356/401 |
| 5,416,395 | 5/1995 | Hiramatsu et al. | 318/600 |

*Primary Examiner*—Brian Sircus
*Attorney, Agent, or Firm*—Fitzpatrick, Cella, Harper & Scinto

[57] ABSTRACT

A method of controlling a stage includes the steps of setting a plurality of drive modes according to which the stage is driven, which correspond to a plurality of positioning processes for positioning an element supported by the stage, and driving the stage according to the plurality of drive modes corresponding to the plurality of positioning processes. An exposure apparatus employing such a method includes a stage mechanism on which a substrate is placed, an exposure device for exposing the substrate to light, a memory for storing data representing a plurality of drive modes according to which the stage mechanism is driven for positioning the substrate, a driver for driving the stage mechanism in accordance with the drive modes, and a controller for selecting one of the drive modes stored in the memory in accordance with a positioning process according to which the substrate is to be positioned, and for controlling the driver in accordance with the selected drive mode.

15 Claims, 6 Drawing Sheets

METHOD OF CONTROLLING A STAGE AND A SYSTEM SUCH AS AN EXPOSING APPARATUS USING THE SAME

This application is a continuation of application Ser. No. 08/277,485 filed Jul. 19, 1994, now abandoned.

BACKGROUND OF THE INVENTION

1. Field of the Invention

The present invention relates to a method of controlling the position of the stage of an exposing apparatus, and more particularly to a method of controlling the position of a stage for use in an exposing apparatus.

2. Description of the Related Art

If a stage for precisely positioning a wafer for use in an exposure apparatus or the like has a multiplicity of axes along which it can move, the influence of forces generated when the wafer is driven along one axis on another axis cannot be prevented even in a case where the stage is driven along a single axis. As a result, precise positioning of the wafer using only mechanisms for moving the stage along the different axes encounters the following problems.

(1) The accuracy of each mechanism must be improved in order to manufacture a positioning apparatus capable of meeting a desired stage moving accuracy. Therefore, the manufacturing cost cannot be reduced and the time required to manufacture the apparatus cannot be shortened.

(2) The environmental conditions with which the desired stage movement accuracy can be met are limited.

In order to reduce the manufacturing cost and shorten the time taken to manufacture the apparatus capable of meeting the required stage movement accuracy while realizing a precise positioning capability not limited by environmental conditions, a stage position correction method has been employed. As a method of correcting the stage position, the following methods have been employed:

(1) The amount of interference with the movement of the stage along another axis that can be generated at the time of a positioning operation along an axis is previously calculated before the operation of positioning the stage along this axis so as to correct the position of the stage along each axis.

(2) After the positioning operation along one axis has been performed, the interference with the movement of the stage along another axis is corrected in such a manner that the generated interference with the movement of the stage along another axis is made to be zero.

In an actual process of the exposure apparatus, the position of the stage along each shaft and the methods for positioning the stage along each shaft are divided into the following two categories.

(1) The position of the stage along one axis must be positioned precisely in such a manner that the influence of the movement of the stage along another axis cannot be disregarded, and a method of positioning the foregoing position (the position accuracy is about ±0.01 micrometer).

In this case, the interference with the movement of the stage along another axis can be prevented by a method in which only an axis the movement along which does not interfere with the movement along another axis is used to position the stage, by a method in which the amount of interference with the movement of the stage along another axis that can be generated at the time of a positioning operation of the stage is previously calculated before the positioning operation is performed and the position of the stage along each axis is corrected, or by a method in which a driving operation for correcting the amount of interference with the movement of the stage along another axis is so performed that the generated amount of interference with the movement of the stage along the another axis is made to be zero. Therefore, precise positioning of the stage can be achieved. However, the time (hereinafter called a "positioning period") required to complete the positioning operation cannot be shortened.

(2) The stage is positioned at a position at which one is able to disregard the influence of another axis and a positioning method therefor (the position accuracy is about ±1.0 micrometer).

In this case, the amount of interference with the movement of the stage along another axis is not calculated and a drive operation for correcting the amount of the interference with the movement of the stage along the another axis generated after a positioning operation of the stage is performed is not performed. Therefore, the positioning period can significantly be shortened although positioning cannot be achieved precisely.

However, the conventional structure for performing these methods is arranged in such a manner that the correction of the amount of interference with the movement of the stage along another axis is performed and precise positioning of the stage is performed regardless of the functions required for carrying out each command for positioning the stage. Therefore, the positioning operation is performed with excessive accuracy even for a positioning operation in which shortening of the positioning period is given priority over precise positioning. As a result, the positioning time cannot be shortened, and therefore an optimum positioning method satisfying the function required for each location command has not been employed.

SUMMARY OF THE INVENTION

An object of the present invention is to provide a stage control method capable of always performing an optimum positioning method while satisfying the functions required for each positioning command.

According to one aspect, the present invention which achieves these objectives relates to a method of controlling a stage comprising the steps of setting a plurality of drive modes according to which the stage is driven, which correspond to a plurality of positioning processes for positioning an element supported by the stage, and driving the stage according to the plurality of drive modes corresponding to the plurality of positioning processes.

The stage can comprise a major-movement stage mechanism and a fine-movement stage mechanism. In this embodiment the setting step comprises the step of setting a plurality of drive modes according to which the stage is driven by the major-movement stage mechanism and the minor movement stage mechanism, and the driving step comprises the step of driving the stage according to the plurality of drive modes with the major-movement stage mechanism and the fine-movement stage mechanism. The setting step can further comprise the steps of setting a drive mode in which the major-movement stage mechanism drives the stage and the fine-movement stage mechanism does not drive the stage, setting a drive mode in which both the major-movement stage mechanism and the fine-movement stage mechanism drive the stage, and setting a drive mode in which the fine-movement stage mechanism drives the stage and the major-movement stage mechanism does not drive the stage.

The stage can be drivable along a plurality of shafts by the major-movement and fine-movement stage mechanisms. The driving of the stage along one shaft by a certain amount changes the position of the stage along another shaft by a predetermined amount. In addition, the driving step can comprise the step of driving the stage according to the plurality of driving modes along the plurality of shafts. Moreover, the setting step can also comprise the steps of setting a mode in which the stage is driven to correct the predetermined amount of change in the position of the stage along the another shaft and setting a drive mode in which the stage is driven without correcting the predetermined amount of change in the position of the stage along the another shaft. The predetermined amount of correction can be a correction in the amount of change in the attitude of the stage, a correction in the amount of abbe error of the stage, or a correction in the amount of movement due to the movement of the stage by the major-movement stage mechanism along the X and Y axes. The setting step can also comprise the step of setting a plurality of drive modes, each of which uses data from different length-measuring means to determine the manner in which the stage is driven. The different length-measuring means can each comprise a length measuring unit and a laser interference meter provided for the major-movement stage mechanism.

According to still another aspect, the present invention which achieves these objectives relates to an exposure apparatus comprising a stage mechanism on which a substance is placed, exposing means for exposing the substrate to light, storage means for storing data representing a plurality of drive modes according to which the stage mechanism is driven for positioning the substrate, driving means for driving the stage mechanism in accordance with the plurality of drive modes, and control means for selecting one of the drive modes stored in the storage means in accordance with a positioning process according to which the substrate is to be positioned, and for controlling the driving means in accordance with the selected drive mode. The stage mechanism can comprise a major-movement stage mechanism and a fine-movement stage mechanism. In this embodiment each of the major-movement stage mechanism and the fine-movement stage mechanism comprises an X axis stage mechanism and a Y axis stage mechanism. Moreover, the apparatus can further comprise measuring means for measuring the position of the stage mechanism.

Other and further objects, features and advantages of the invention will be evident from the following detailed description of preferred embodiments when taken in conjunction with the attached drawings.

DESCRIPTION OF THE PREFERRED EMBODIMENTS

First Embodiment

A first embodiment of the present invention will now be described with reference to the drawings.

Figure 1:
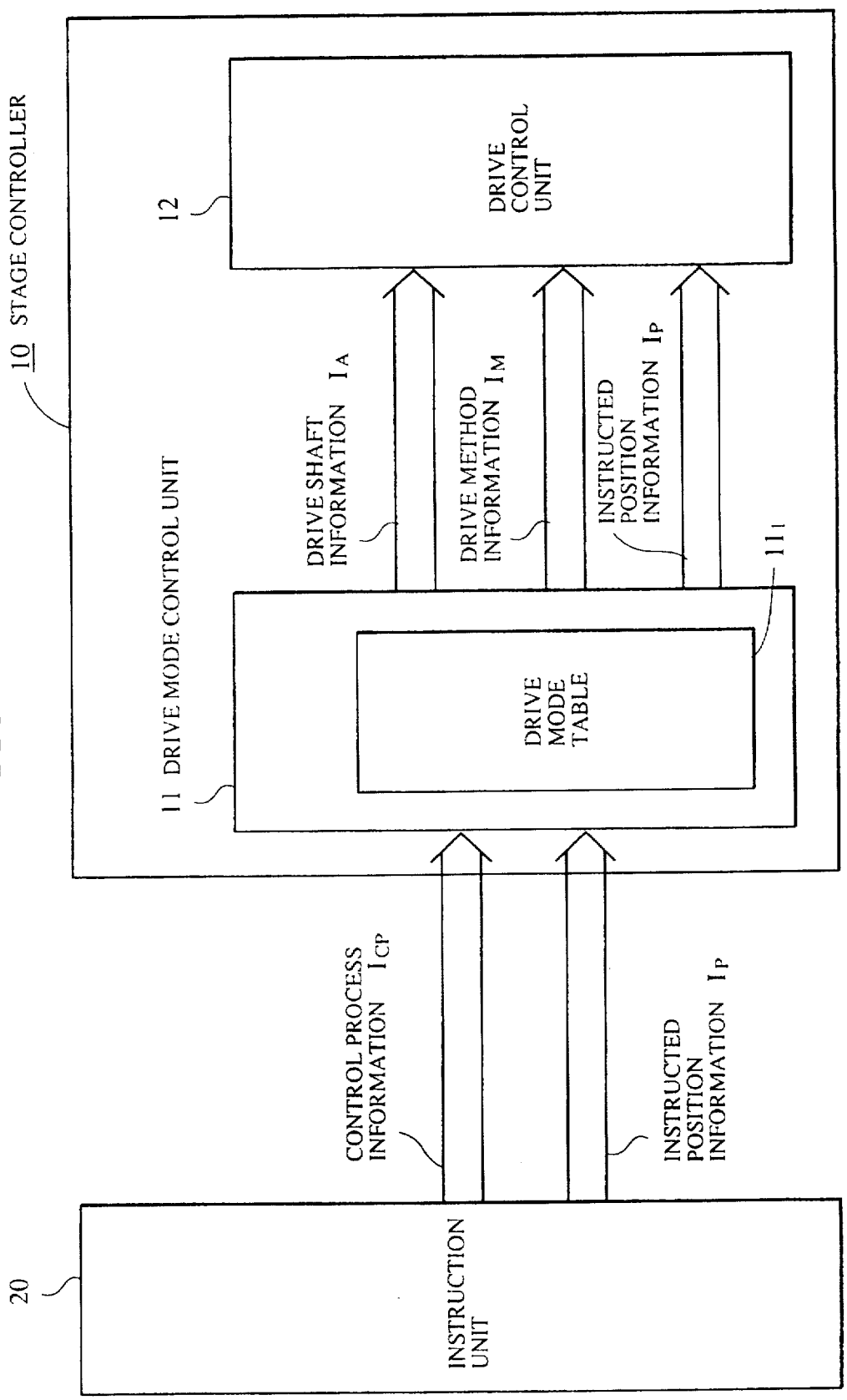
FIG. 1 is a block diagram which illustrates a stage controller in which one embodiment of a stage control method according to the present invention can be embodied.
Figure 2:
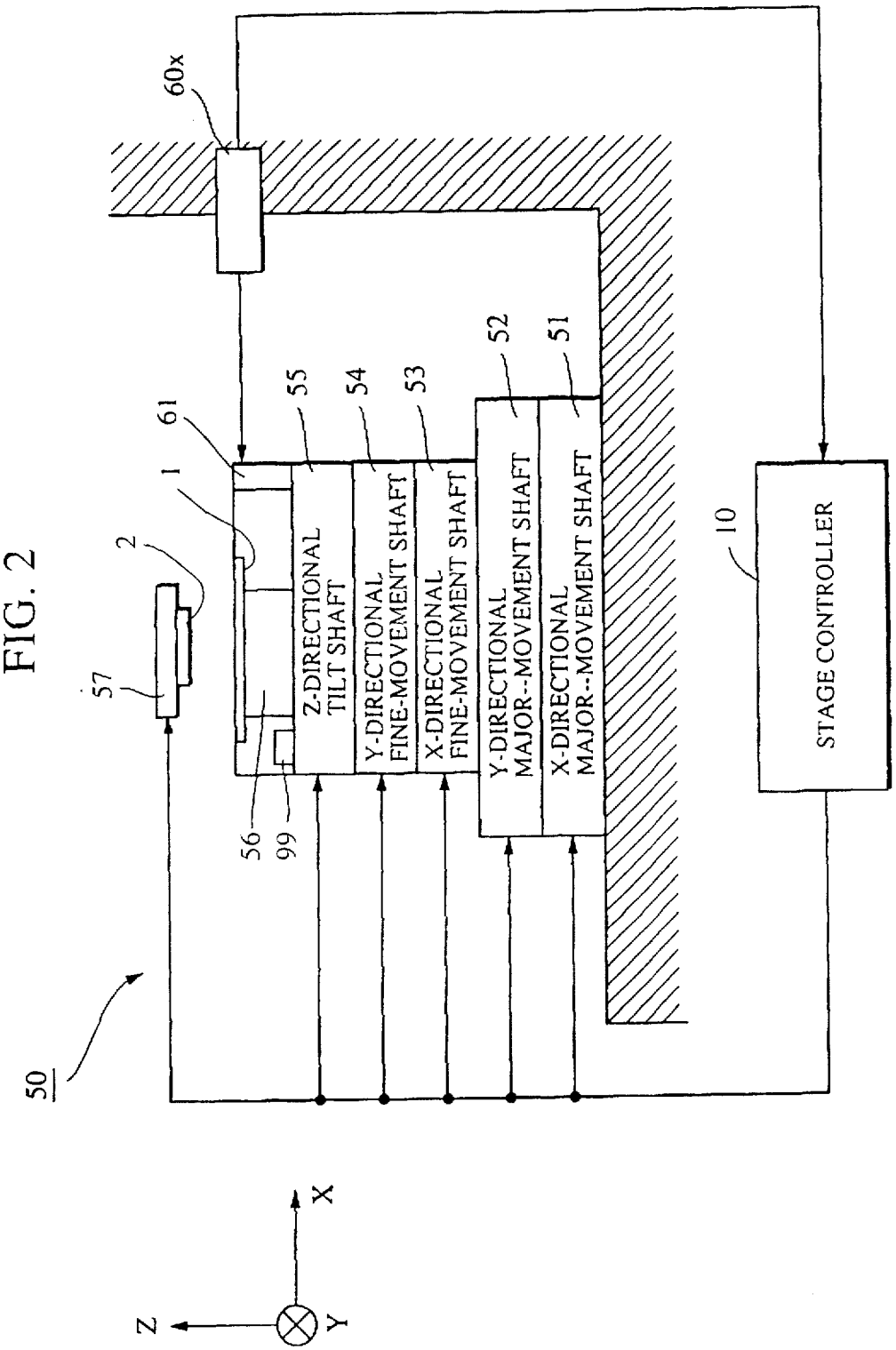
FIG. 2 is a schematic side view which illustrates a stage portion of an exposure apparatus in which a stage is positioned by the stage controller shown in FIG. 1.

FIG. 1 is a block diagram which illustrates a stage controller in which a first embodiment of a method of controlling the stage position according to the present invention can be embodied. FIG. 2 is a schematic side view which illustrates a stage portion of an exposing apparatus having the stage which is positioned by the stage controller shown in FIG. 1.

A stage controller 10 processes the results of measurement performed by each of laser interference meters (X-axis laser interference meter $60_X$ and the like) and controls the operation of each shaft of a stage portion or stage 50 shown in FIG. 2. The stage controller 10 comprises: a drive mode control unit 11, to which control process information $I_{CP}$ and instructed position information $I_P$ are transmitted from an instruction unit 20; and a drive control unit 12 for driving the shafts of the stage portion 50 in accordance with drive shaft information $I_A$, drive method information $I_M$ and instructed position information $I_P$. The drive mode control unit 11 has a drive mode table $11_1$ storing data relating to a plurality of drive modes instructing the control of the stage. The drive control unit 12 is supplied with results of measurements performed by laser interference meters.

The stage portion 50 of the exposing apparatus, as shown in FIG. 2, comprises: an X-directional major-movement shaft 51 provided with a distance-measurement means (not shown) such as an encoder or an optical scale providing a high drive resolution and distance resolution; a Y-directional major-movement shaft 52 provided with a distance-measurement means (not shown) such as an encoder or an optical scale providing a high drive resolution and distance resolution; an X-directional fine-movement shaft 53; a Y-directional fine-movement shaft 54; a Z-directional tilt shaft 55; a wafer chuck 56 for holding a wafer 1; a mask shaft 57 for positioning the mask 2; an X-directional laser interference meter $60_X$; a Y-directional laser interference meter (not shown); an X-directional-rotation laser interference meter (not shown); a Y-directional-rotation laser interference meter (not shown); a Z-directional-rotation laser interference meter (not shown); and a mirror 61 for reflecting light to the various laser interference meters so they can measure various distances from the mirror 61 to the various laser interference meters.

The Z-directional tilt shaft 55 is composed of three piezo stacks (not shown) for moving the wafer chuck 56 in a Z direction with respect to the Y-directional fine-movement shaft 54. The piezo stacks are, on the XY plane, equally spaced on the circumference around the center of the wafer chuck 56. Thus, by varying the driving amount of the piezo stacks, the surface of the wafer chuck 56, which holds the wafer 1, can be tilted with respect to the XY plane, the wafer chuck 56 being capable of moving in the Z direction.

The position at which the wafer chuck 56 is positioned will now be described with reference to FIG. 3.

First to fourth exposing shot positions $Q_{S1}$ to $Q_{S4}$ respectively indicate exposing shot positions on the wafer 1. An exposure pattern P is a pattern exposed to light through the mask 2. Wafer replacement position $Q_U$ is a position at which the center of the wafer chuck 56 is positioned when the wafer 1 is replaced by moving a wafer from a wafer hand 70 to the wafer chuck 56. Pre-alignment position $Q_{PA}$ is a position at which the center of the wafer chuck 56 is positioned when the wafer 1 is previously aligned. Fine alignment position $Q_{FA}$ is a position at which one of the first to fourth exposing shot positions $Q_{S1}$ to $Q_{S4}$ is precisely positioned with respect to the exposure pattern P of the mask 2. An exposure shot region A is a region in which the center of the wafer chuck 56 is positioned when one of the first to fourth exposing shot positions $Q_{S1}$ to $Q_{S4}$ is positioned at the fine alignment position $Q_{FA}$. A wafer chuck retracting position $Q_E$ is a position at which the center of the wafer chuck 56 is positioned when the wafer chuck 56 is retracted at the time of replacing the mask 2. Mask alignment position $Q_{MA}$ is a position at which the center of the wafer chuck 56 is positioned when a reference mark (not shown) on the mask 2 is precisely positioned with respect to a mask-axis stage reference 99 on the mirror 61 with which a laser interference meter measures the distance from the mirror 61 to the laser interference meter.

A process of controlling the drive of the stage portion 50 of the exposing apparatus will now be described.

(1) Wafer Receipt Process

In this process, the wafer 1 is moved from the wafer hand 70 to the wafer chuck 56. The wafer 1 received by the wafer chuck 56 is positioned at the pre-alignment position $Q_{PA}$ in its Z-directional rotational direction. Then, the wafer 1 is precisely aligned with respect to the mask 2 for each exposure shot at the fine alignment position in the exposure shot region A. Therefore, it is preferable that shortening of the time required to perform positioning of the stage be given priority over precise positioning of the stage when the center of the wafer chuck 56 is positioned at the wafer replacement position $Q_U$.

(2) Pre-Alignment Process

In this process, the wafer 1 is positioned along a direction in which it rotates around the Z axis. The operation of positioning the wafer 1 in the direction in which it rotates around the Z axis is performed by positioning a reference mark (not shown) on the wafer 1 with respect to a reference position (not shown) for positioning the wafer chuck 56 in the direction of rotation around the Z axis. Therefore, when the center of the wafer chuck 56 is positioned to the pre-alignment position $Q_{PA}$, it is preferable that precise positioning of the stage be given priority in the Y direction and shortening of time required to complete positioning of the stage be given priority in the X direction by employing a method of detecting the amount of deviation between the reference position for positioning the wafer chuck 56 in a direction of rotation around the Z axis and the reference mark on the wafer 1.

(3) Mask Replacement Process

In this process, the mask 2 is replaced. When the mask 2 is replaced, the wafer chuck 56 is positioned at the wafer chuck retracting position $Q_E$ at which the wafer chuck 56 is positioned during the replacement operation. As a result, a mask conveyance apparatus (not shown) and the wafer chuck 56 are protected safely. Therefore, when the center of the wafer chuck 56 is positioned at the wafer chuck retracting position $Q_E$, it is preferable that shortening of the time required to complete positioning of the stage be given priority over precise positioning of the stage.

(4) Mask Alignment Process

The reference mark (not shown) on the mask 2 is precisely aligned with the mask-axis stage reference 99 on the mirror 61 with which the laser interference meter measures the distance from the mirror 61 to the laser interference meter. Therefore, when the center of the wafer chuck 56 is positioned at the mask alignment position $Q_{MA}$, it is preferable that precise positioning of the stage be given priority. When the center of the wafer chuck 56 is moved from the wafer chuck retracting position $Q_E$, at which the wafer chuck 56 is retracted during the replacement of the mask 2, to the mask alignment position $Q_{MA}$, the movement is performed by using the X-directional major-movement shaft 51, the Y-directional major-movement shaft 52, the X-directional fine-movement shaft 53 and the Y-directional fine-movement shaft 54 because of the drive stroke needed for such movement. The foregoing case, in which the X-directional major-movement shaft 51 and the Y-directional major-movement shaft 52 are driven, involves interference with the movement of the wafer chuck 56 along another shaft. In other words, the driving of the wafer chuck 56 along the shafts 51 and 52 by a certain amount changes the position of the wafer chuck 56 along another shaft by a predetermined amount. As will be discussed in more detail below, the present invention provides devices to drive the stage and the wafer chuck 56 to correct this predetermined amount of change in the position of the stage and the wafer chuck 56 along the another shaft. Thus, correction of the interference with the movement of the wafer chuck 56 along another shaft enables precise positioning to be performed.

(5) Exposing Shot Locating Process

In this process, one of the first to fourth exposing shot positions $Q_{S1}$ to $Q_{S4}$ is precisely positioned at the fine alignment position $Q_{FA}$. Therefore, it is preferable in this case that precise positioning be given priority. Since the X-directional distance and the Y-directional distance between the exposure shots is longer than the stroke of the X-directional fine-movement shaft 53 and the Y-directional fine-movement shaft 54, positioning is performed by using the X-directional major-movement shaft 51, the Y-directional major-movement shaft 52, the X-directional fine-movement shaft 53 and the Y-directional fine-movement shaft 54. Therefore, the foregoing case, in which the X-directional major-movement shaft 51 and the Y-directional major-movement shaft 52 are driven, involves interference with the movement of the stage along another shaft. However, correction of the interference with another shaft enables precise positioning to be performed.

(6) Fine Alignment Process

One of the first to fourth exposing shot positions $Q_{S1}$ to $Q_{S4}$ is precisely aligned with the exposure pattern P on the mask 2. Therefore, when each of the first to fourth exposing shot positions $Q_{S1}$ to $Q_{S4}$ is aligned with the exposure pattern P, it is preferable that precise positioning be given priority. In this case, positioning is performed in such a manner that the wafer chuck 56 is previously positioned at the fine alignment position $Q_{FA}$ and the amount of deviation of the present exposure shot position from the exposure pattern P of the mask 2 measured by an external measuring means (not shown) is used to determine the distance the wafer chuck 56 needs to move to eliminate the deviation and the wafer chuck 56 is then driven to correct the deviation so it is zero. That is, the previous positioning of one of the exposing shot positions at the fine alignment position $Q_{FA}$ causes the distance the wafer chuck 56 needs to move to correct the deviation to be within the stroke of the X-directional fine-movement shaft 53 and the Y-directional fine-movement shaft 54. Therefore, by driving the wafer chuck 56 by using only the X-directional fine-movement shaft 53 and the Y-directional fine-movement shaft 54, positioning can be performed without interfering with the movement of the stage 50 or the wafer chuck 56 along another shaft.

(7) Wafer Receipt Process

In this process, the wafer 1 held by the wafer chuck 56 is received by the wafer hand 70. When the wafer chuck 56 is positioned at the wafer replacement position $Q_U$, it is preferable that shortening of the time required to complete positioning of the wafer chuck 56 be given priority to precise positioning of the wafer chuck 56.

The foregoing process of controlling the drive of the stage 50 includes the first to fourth drive modes below.

(1) First Drive Mode

When X-directional positioning and Y-directional positioning operations are performed, shortening of the time required to complete the positioning of the wafer chuck 56 be given priority.

That is, only the X-directional major-movement shaft 51 and the Y-directional major-movement shaft 52 are driven, and the interference with the movement of the wafer chuck 56 along another shaft involved when the X-directional major-movement shaft 51 and the Y-directional major-movement shaft 52 are driven is not corrected. Thus, the time taken to complete positioning in the X and Y directions is shortened. In this case, a drive method is employed in which measuring data from length measuring means, each provided for the X-directional major-movement shaft 51 and the Y-directional major-movement shaft 52, are used to perform positioning of the wafer chuck 56 by means of the X-directional major-movement shaft 51 and the Y-directional major-movement shaft 52. Before the X-directional major-movement shaft 51 and the Y-directional major-movement shaft 52 are driven, the X-directional fine-movement shaft 53 and the Y-directional fine-movement shaft 54 are positioned at intermediate positions of their strokes. The X-directional major-movement shaft 51 and the Y-directional major-movement shaft 52 are driven simultaneously. The foregoing method is called an "XY-directional major-movement drive method".

The foregoing drive mode (a first drive mode) is employed when the center of the wafer chuck 56 is positioned at the wafer replacement position $Q_U$ and when the center of the wafer chuck 56 is positioned at the wafer chuck retracting position $Q_E$ at the time of replacing the mask 2. The first drive mode is employed to drive the X-directional major-movement shaft 51 or the Y-directional major-movement shaft 52 or when the Z-directional tilt shaft 55 is driven without abbe error quantity correction driving.

(2) Second Drive Mode

In this mode X-directional positioning and Y-directional positioning are performed, but only positioning along the Y axis is precisely performed.

That is, the X-directional drive is performed by only the X-directional major-movement shaft 51 and the interference with the driving of the wafer chuck 56 by shafts 53 and 54 and 55 that arises due to driving of the X-directional major-movement shaft 51 and the Y-directional major-movement shaft 52 is corrected in only the Y direction so that positioning of the wafer chuck 56 only in the Y direction is precisely performed. In this case, the X-directional major-movement shaft 51, the Y-directional major-movement shaft 52, the Y-directional fine-movement shaft 54 and the Z-directional tilt shaft 55 for correcting the interference with the movement of the wafer chuck 56 along another shaft are used as the drive shafts.

In this case, a drive method arranged as follows is performed: initially, measuring data from length measuring means, provided for the X-directional major-movement shaft 51 and the Y-directional major-movement shaft 52, are used to perform the positioning operation by using the X-directional major-movement shaft 51 and the Y-directional major-movement shaft 52. Moreover, data from the laser interference meter is used to perform the positioning operation by means of the Y-directional major-movement shaft 52. Then, data from the laser interference meter is used to perform the positioning operation by means of the Y-directional fine-movement shaft 54. Before the X-directional major-movement shaft 51 and the Y-directional major-movement shaft 52 are driven, the X-directional fine-movement shaft 53 and the Y-directional fine-movement shaft 54 are positioned at the intermediate positions of their stroke. The X-directional major-movement shaft 51 and the Y-directional major-movement shaft 52 are simultaneously driven. The interference with the positioning of the wafer chuck 56 along another shaft is corrected by a method in which the interference is previously calculated (i.e. the distance the wafer chuck 56 moves along the another shaft is previously calculated) and thus the positioning position for each shaft is corrected before the positioning drive is performed and/or a method in which a driving of the wafer chuck 56 for correcting the interference is performed to make the generated interference zero. The correcting of the interference is performed by a drive device for correcting the amount of change in the attitude of the wafer chuck 56, a drive device for correcting the amount of abbe error of the wafer chuck 56 and a drive device for correcting the interference arising from the driving of the wafer chuck 56 along the X and Y axes with another axis. The drive method above is called a "major movement along the X-axis and major and fine movements along the Y-axis drive method".

The second drive mode is employed in a case where the center of the wafer chuck 56 is positioned at the pre-alignment position $Q_{PA}$. The driving operation to be performed in the second drive mode comprises driving operations using the X-directional major-movement shaft 51, the Y-directional major-movement shaft 52 and the Y-directional fine-movement shaft 54.

(3) Third Drive Mode

When positioning of the wafer chuck 56 in the directions of the X and Y axes is performed, precise positioning in both directions of the X-axis and Y-axis is given priority.

That is, an interference with the movement of the wafer chuck 56 along another axis, generated when the X-directional major-movement shaft 51 and the Y-directional major-movement shaft 52 are driven, is corrected so that positioning of the wafer chuck 56 in the directions of the X-axis and Y-axis is performed precisely. In this case, the following drive shafts are driven to correct the interference with the movement of the wafer chuck 56 along another shaft: the X-directional major-movement shaft 51, the Y-directional major-movement shaft 52, the X-directional fine-movement shaft 53, the Y-directional fine-movement shaft 54 and the Z-directional tilt shaft 55.

In this mode, the following drive method is employed: data from the distance measuring means provided for the X-directional major-movement shaft 51 and the Y-directional major-movement shaft 52, are used to position the X-directional major-movement shaft 51 and the Y-directional major-movement shaft 52. Then, the laser interference meter is used to position the X-directional major-movement shaft 51 and the Y-directional major-movement shaft 52. Then, the laser interference meter is used to position the X-directional fine-movement shaft 53 and the Y-directional fine-movement shaft 54. Before the X-directional major-movement shaft 51 and the Y-directional major-movement shaft 52 are driven, the X-directional fine-movement shaft 53 and the Y-directional fine-movement shaft 54 are positioned at the intermediate positions of their stroke. The X-directional major-movement shaft 51 and the Y-directional major-movement shaft 52 are simultaneously driven, and the X-directional fine-movement shaft 53 and the Y-directional fine-movement shaft 54 are simultaneously driven. The interference with the movement of the wafer chuck 56 along another shaft is corrected by a method in which the interference is previously calculated and thus, the positioning position for each shaft is corrected before the positioning drive is performed and/or a method in which a driving operation of the wafer chuck 56 for correcting the interference is performed to make the generated interference zero. The correcting of the interference is performed by a drive device for correcting the amount of change in the attitude of the wafer chuck 56, by a drive device for correcting the amount of abbe error of the wafer chuck 56 and a drive device for correcting the interference of the driving of the wafer chuck 56 along the X and Y axes with another axis. The drive method above is called a "major and fine movements along the X and Y axes drive method".

The third drive mode is employed in a case where the exposure shot position is positioned at the fine alignment position $Q_{FA}$ and in a case where the center of the wafer chuck 56 is positioned at the mask alignment position $Q_{MA}$. The following shafts are driven in the third drive mode: the X-directional major-movement shaft 51, the Y-directional major-movement shaft 52, the X-directional fine-movement shaft 53, the Y-directional fine-movement shaft 54 and the Z-directional tilt shaft 55 which is driven to correct the amount of abbe error.

(4) Fourth Drive Mode

In this mode positioning of the wafer chuck 56 in the direction of X-axis and Y-axis is performed in such a manner that positioning of the wafer chuck 56 is given priority for both the X-axis and the Y-axis.

That is, only the X-directional fine-movement shaft 53 and the Y-directional fine-movement shaft 54 are driven so that interference with movement of the wafer chuck 56 along another axis is prevented, positioning in the directions of the X and Y axes is performed precisely, and the time required to complete positioning is shortened. In this mode, the X-directional fine-movement shaft 53 and the Y-directional fine-movement shaft 54 are driven.

The driving operation is performed in this case in such a manner that data from the laser interference meter is used to position the X-directional fine-movement shaft 53 and the Y-directional fine-movement shaft 54, respectively. The X-directional fine-movement shaft 53 and the Y-directional fine-movement shaft 54 are simultaneously driven. The foregoing drive method is called a "fine-movement XY-axes drive method".

The fourth drive mode is performed in a case where the pattern of the mask 2 and the exposure shot are precisely positioned at the fine alignment position $Q_{FA}$. The X-directional fine-movement shaft 53 and the Y-directional fine-movement shaft 54 are driven in the fourth drive mode.

Although only the drive modes to be employed when positioning is performed in the direction X and the direction Y have been described, a drive mode in a direction of another axis is also performed (using for example, the Z-directional tilt shaft 55). However, a description of the driving of this type is omitted here.

The correspondence between the control processes and the drive modes from the viewpoint of their function is as shown in Table 1.

TABLE 1

Correspondence between Control Processes and Drive Modes

| Control Process | Drive Mode |
|---|---|
| wafer receipt process | first drive mode |
| pre-alignment process | second drive mode |
| mask replacement process | first drive mode |
| mask alignment process | third drive mode |
| exposure shot positioning process | third drive mode |
| fine alignment process | fourth drive mode |
| wafer receipt process | first drive mode |

The flow of information that occurs when a command is issued from the instruction unit 20 to the stage controller 10 shown in FIG. 1 will now be described.

Control process information $I_{CP}$ is transmitted from the instruction unit 20 to the drive mode control unit 11. In the drive mode control unit 11, the drive mode corresponding to the supplied control process information $I_{CP}$ is selected from the Table 1 showing the correspondence between the control process and the drive mode. As a result, the drive mode is set. Moreover, drive shaft information $I_A$ and drive method information $I_M$ corresponding to the set drive mode are read from the drive mode table $11_1$. Then, all positioning drive operations are performed in accordance with the set drive mode as long as the drive mode is not changed. Then, instructed position information $I_P$ is supplied from the instruction unit 20 to the drive mode control unit 11. Drive shaft information $I_A$, drive method information $I_M$ and instructed position information $I_P$ corresponding to the set drive mode are supplied from the drive mode control unit 11 to the drive control unit 12 so that the positioning drive operation is performed.

Figure 4:
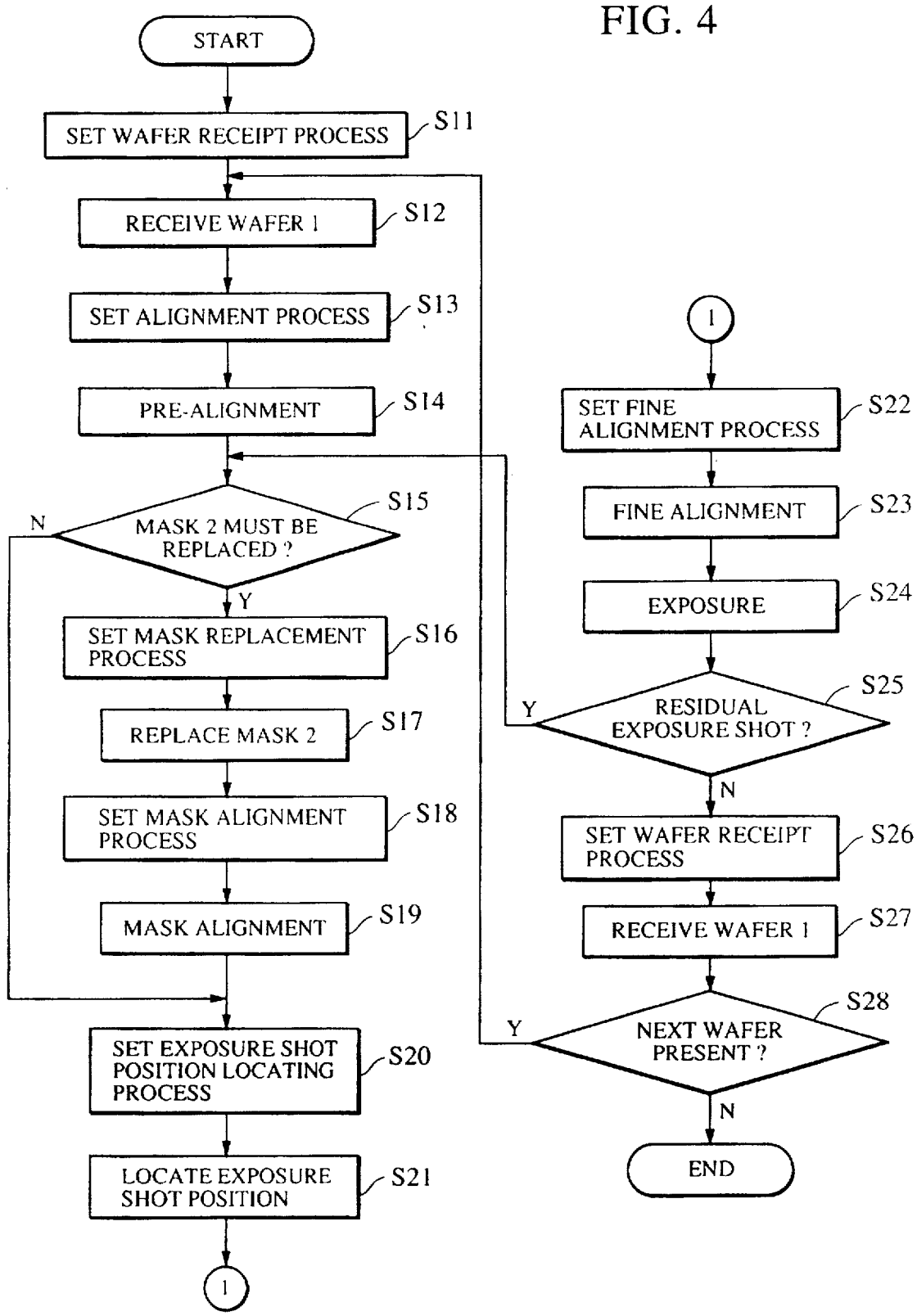
FIG. 4 is a flow chart of the control operation performed by the stage controller shown in FIG. 1.

The method of the present invention will now be described with reference to a flow chart shown in FIG. 4 in accordance with an actual exposure sequence.

Initially, the control process is set to the wafer receipt process by supplying control process information $I_{CP}$, denoting the wafer receipt process, from the instruction unit 20 to the drive mode control unit 11. In the drive mode control unit 11, the drive mode is set to the first drive mode (see Table 1) corresponding to the wafer receipt process (step S11). All positioning drive operations are performed in the first drive mode until a next drive mode is set.

Then, the wafer chuck 56 is positioned at the wafer replacement position $Q_U$ (see FIG. 3) to receive the wafer 1 from the wafer hand 70 in accordance with instructed position information $I_P$, denoting the wafer replacement position $Q_U$, supplied from the instruction unit 20 to the drive mode control unit 11. Since the drive mode is set to the first drive mode in this state, drive shaft information $I_A$ denoting the "X-directional major-movement shaft 51 and the Y-directional major-movement shaft 52", drive method information $I_M$ denoting the "XY-directional major-movement drive method", and instructed position information $I_P$, denoting the wafer replacement position $Q_U$, are supplied from the drive mode control unit 11 to the drive control unit 12 so that the positioning drive operation is performed in accordance therewith. When the wafer chuck 56 is positioned at the wafer replacement position $Q_U$, the wafer 1 held by the wafer hand 70 is received by the wafer chuck 56 (step S12).

Then, in order to set the control process to the pre-alignment process, control process information $I_{CP}$, denoting the pre-alignment process, is supplied from the instruction unit 20 to the drive mode control unit 11. In the drive mode control unit 11, the drive mode is set to the second drive mode (see Table 1) corresponding to the pre-alignment process (step S13). All positioning drive operations are performed in the second drive mode until a next drive mode is set.

Then, the wafer chuck 56 is positioned at the pre-alignment position $Q_{PA}$ (see FIG. 3) and thus the wafer 1 is positioned along the direction of rotation around the Z axis by supplying instructed position information $I_P$, denoting the pre-alignment position $Q_{PA}$, from the instruction unit 20 to the drive mode control unit 11. Since the drive mode is set to the second drive mode, drive shaft information $I_A$, denoting the X-directional major-movement shaft 51, the Y-directional major-movement shaft 52, the Y-directional fine-movement shaft 54 and the Z-directional tilt shaft 55, drive method information $I_M$ denoting the "major movement along the X-axis and major and fine movements along the Y-axis drive method", and instructed position information $I_P$ denoting the pre-alignment position $Q_{PA}$, are supplied from the drive mode control unit 11 to the drive control unit 12 so that the positioning drive operation is performed in accordance therewith. When the wafer chuck 56 is positioned at the pre-alignment position $Q_{PA}$, the wafer 1 is positioned along the direction of rotation around Z axis in a pre-alignment step (step S14).

Then, whether or not the mask 2 must be replaced is discriminated (step S15). If a discrimination has been made that the replacement of the mask 2 is not required, the method proceeds to step S20 (for setting the exposure shot position positioning process).

If a discrimination is made in step S15 that the mask 2 must be replaced, the control process is set to the mask replacement process (step S16) in accordance with the control process information $I_{CP}$, denoting the mask alignment process, which is supplied from the instruction unit 20 to the drive mode control unit 11. The mask 2 is then replaced (step S17) and in the drive mode control unit 11, the drive mode is set to the third drive mode (see Table 1) corresponding to the mask alignment process (step S18). All positioning drive operations are performed in accordance with the third drive mode until a next drive mode is set.

Then, the center of the wafer chuck 56 is positioned at the mask alignment position $Q_{MA}$ and thus the reference mark on the mask 2 is precisely positioned with respect to the mask-axis stage reference 99 on the mirror 61 with which the laser interference meter measures the distance from the interference meter to the mirror 61 in accordance with instructed position information $I_P$, denoting the mask alignment position $Q_{MA}$ (see FIG. 1), supplied from the instruction unit 20 to the drive mode control unit 11. Since the drive mode is set to the third drive mode, drive shaft information $I_A$ denoting the X-directional major-movement shaft 51, the Y-directional major-movement shaft 52, the X-directional fine-movement shaft 53 and the Y-directional fine-movement shaft 54, drive method information $I_M$ denoting the "major and fine movements along the X and Y axes drive method", and instructed position information $I_P$ denoting the mask alignment position $Q_{MA}$, are supplied from the drive mode control unit 11 to the drive control unit 12 so that the positioning drive operation is performed in accordance therewith. When the center of the wafer chuck 56 is positioned at the mask alignment position $Q_{MA}$, mask alignment is performed (step S19).

In order to set the control process to the exposure shot positioning process, control process information $I_{CP}$ denoting the exposure shot positioning process is supplied from the instruction unit 20 to the drive mode control unit 11. In the drive mode control unit 11, the drive mode is set to the third drive mode (see Table 1), corresponding to the exposure shot position positioning process (step S20). All positioning drive operations are performed in the third drive mode until a next drive mode is set.

Figure 3:
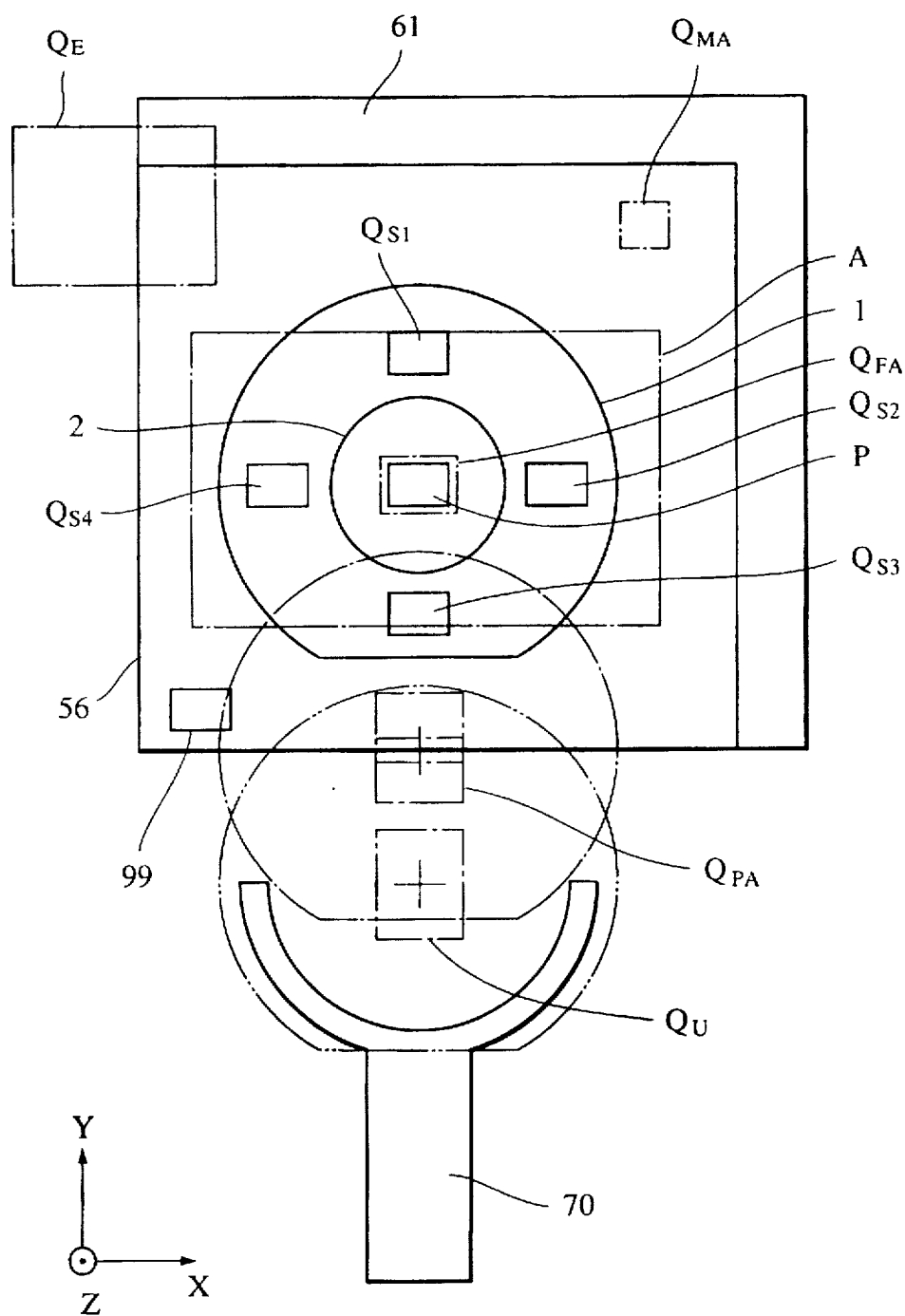
FIG. 3 is a schematic top view which illustrates the position at which the wafer chuck shown in FIG. 2 is positioned.

Then, the present exposure shot position (for example, the first exposure shot position $Q_{S1}$ shown in FIG. 3) is positioned at the fine alignment position $Q_{FA}$ in accordance with the instructed position information $I_P$ (see Table 1) denoting the position of the center of the wafer chuck 56 when the first exposure shot position $Q_{S1}$ is positioned at the fine alignment position $Q_{FA}$ and supplied from the instruction unit 20 to the drive mode control unit 11. Since the drive mode is set to the third drive mode, drive shaft information $I_A$ denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_M$ denoting the "major and fine movements along the X and Y axes drive method", and instructed position information $I_P$ denoting the center of the wafer chuck 56 are supplied from the drive mode control unit 11 to the drive control unit 12 so that the positioning drive operation is performed in accordance therewith (step S21).

In order to set the control process to the fine alignment process, control process information $I_{CP}$ denoting the fine alignment process is supplied from the instruction unit 20 to the drive mode control unit 11. In the drive mode control unit 11, the drive mode is set to the fourth drive mode (see Table 1) corresponding to the fine alignment process (step S22). All positioning drive operations are performed in the fourth drive mode until a next drive mode is set.

Then, the present exposure shot position (for example, the first exposure shot position $Q_{S1}$ shown in FIG. 3) and the exposure pattern P of the mask 2 are precisely aligned with each other as follows: the amount of deviation of the first exposure shot position $Q_{S1}$ from the exposure pattern P of the mask 2 is measured by an external measuring means (not shown); and instructed position information $I_P$ (see Table 1) denoting the positioning position of the center of the wafer chuck 56, corrected in accordance with the measured amount of deviation, is supplied from the instruction unit 20 to the drive mode control unit 11. Since the drive mode is set to the fourth drive mode at this time, drive shaft information $I_A$ denoting the X-directional fine-movement shaft 53 and the Y-directional fine-movement shaft 54, drive method information $I_M$ denoting the "fine-movement XY-axes drive method", and instructed position information $I_P$ denoting the center of the wafer chuck 56, are supplied from the drive mode control unit 11 to the drive control unit 12 so that the positioning drive operation is performed in accordance therewith in a fine alignment step (step S23).

Then, the exposure of the mask 2 to radiation is performed (step S24), and a discrimination is made whether or not residual exposure shot is present (step S25). If a discrimination is made that residual exposure shot is present, the method proceeds to step S15 (for discrimination whether or not the mask 2 must be replaced).

If a discrimination is made in step S25 that no residual exposure shot is present, the control process is set to the wafer receipt process in accordance with control process information $I_{CP}$ denoting the wafer receipt process, which is supplied from the instruction unit 20 to the drive mode control unit 11. In the drive mode control unit 11, the drive mode is set to the first drive mode (see Table 1) corresponding to the wafer receipt process (step S26). All positioning drive operations are performed in the first drive mode until a next drive mode is set.

Then, the wafer chuck 56 is positioned at the wafer replacement position $Q_U$ (see FIG. 3) and thus the wafer 1 is sent to the wafer hand 70 in accordance with instructed position information $I_P$ (see FIG. 1) denoting the wafer replacement position $Q_U$ and supplied from the instruction unit 20 to the drive mode control unit 11. Since the drive mode is set to the first drive mode at this time, drive shaft information $I_A$ denoting the X-directional major-movement shaft 51 and the Y-directional major-movement shaft 52, drive method information $I_M$ denoting the XY-directional major-movement drive method and instructed position information $I_P$ denoting the wafer replacement position $Q_U$, are supplied from the drive mode control unit 11 to the drive control unit 12 so that the positioning drive operation is performed in accordance therewith. When the wafer chuck 56 is positioned at the wafer replacement position $Q_U$, the wafer 1 is sent from the wafer chuck 56 to the wafer hand 70 (step S27).

Then, whether or not a next wafer (a wafer to be then exposed to light) is present is discriminated (step S28). If a discrimination is made that a next wafer is present, the method proceeds to step S12 (for receiving the wafer). If a discrimination is made that no next wafer is present, the operation is completed here.

Second Embodiment

A second embodiment of the method of controlling a stage according to the present invention will now be described. The stage control method according to this embodiment is adapted to a proximity exposure apparatus for exposing the wafer to light in a state where the mask and the wafer are near (that is, the distance from the mask to the wafer is of the order of tens of micrometers). Since the structure of the stage portion 50 and the position to which the wafer chuck is positioned are the same as those shown in FIGS. 2 and 3, this embodiment will now be described with reference to FIGS. 2 and 3.

In a case where positioning of the wafer 1 is performed by using the X-directional major-movement shaft 51 and the Y-directional major-movement shaft 52 in the exposure shot region A of the proximity exposure apparatus, interference of the mask 2 and the wafer 1 with each other is prevented by retracting the Z-directional tilt shaft 55 to a non-interference region when the X-directional major-movement shaft 51 and the Y-directional major-movement shaft 52 are driven. Thus, the mask 2 and the wafer 1 can be maintained safely. Therefore, the following fifth drive mode is provided in the case where a positioning operation between exposing shots in the exposure region A is performed in the proximity exposure apparatus.

The Z-directional tilt shaft 55 is retracted from an original position to a non-interference region before the X-directional major-movement shaft 51 and the Y-directional major-movement shaft 52 are driven and the Z-directional tilt shaft 55 is restored to its original position after the X-directional major-movement shaft 51 and the Y-directional major-movement shaft 52 have been driven so that securing of the mask 2 and the wafer 1 is given priority. Moreover, interference with the movement of the wafer chuck 56 along another shaft which arises when the X-directional major-movement shaft 51 and the Y-directional major-movement shaft 52 are driven is corrected so that the positioning operation in both the X direction and the Y direction is performed precisely. In this case, the following drive shafts are driven: the X-directional major-movement shaft 51, the Y-directional major-movement shaft 52, the X-directional fine-movement shaft 53, the Y-directional fine-movement shaft 54 and the Z-directional tilt shaft 55.

The two following drive methods are employed in this case.

First Drive Method

In this method the Z-directional tilt shaft 55 is retracted to a non-interference region, data from the distance measuring means each provided for the X-directional major-movement shaft 51 and the Y-directional major-movement shaft 52 are used to position the X-directional major-movement shaft 51 and the Y-directional major-movement shaft 52, and then data from the laser interference meter is used to position the X-directional major-movement shaft 51 and the Y-directional major-movement shaft 52. Then, the laser interference meter is used to position the X-directional fine-movement shaft 53 and the Y-directional fine-movement shaft 54. Finally, the Z-directional tilt shaft 55 is restored to its original position.

Second Drive Method:

In this method the X-directional major-movement shaft 51 and the Y-directional major-movement shaft 52 are positioned, and then the Z-directional tilt shaft 55 is restored to its original position. Finally, data from the laser interference meter is used to position the X-directional fine-movement shaft 53 and the Y-directional fine-movement shaft 54.

With either the first drive method or the second drive method, the X-directional fine-movement shaft 53 and the Y-directional fine-movement shaft 54 are positioned at the intermediate positions of their strokes before the X-directional major-movement shaft 51 and the Y-directional major-movement shaft 52 are driven. The X-directional major-movement shaft 51 and the Y-directional major-movement shaft 52 are driven simultaneously. Also the X-directional fine-movement shaft 53 and the Y-directional fine-movement shaft 54 are driven simultaneously. Interference with the movement of the wafer chuck 56 along another shaft is corrected by a method in which interference with the movement of the wafer chuck 56 along another axis is previously calculated before positioning the wafer chuck 56 in the X and Y directions is performed and thus the positioning position for each shaft is corrected and/or by a method in which a drive operation for correcting the interference with the movement of the wafer chuck 56 along another axis is performed to make the interference zero.

The drive operation for correcting the interference with the movement of the wafer chuck 56 along another shaft is performed by a drive device for correcting the amount of change in the attitude of the wafer chuck 56, a drive device for correcting the amount of abbe error of the wafer chuck 56 and a drive device for correcting the interference of the driving of the wafer chuck 56 along the X and Y axes with another axis. The drive method above is called a "Z-directional tilt shaft retraction drive performed via major and fine movements along the X and Y axes drive method".

The fifth drive mode is employed in the case where the exposure shot is positioned at the fine alignment position $Q_{FA}$ and in the case where the center of the wafer chuck 56 is positioned at the mask alignment position $Q_{MA}$ (see FIG. 3). The following drive operations are performed in the fifth drive mode: the Z-directional tilt shaft retraction drive performed via major and fine movements along the X and Y axes drive method, and an abbe error correction drive operation performed via the driving of the Z-directional tilt shaft.

The correspondence between the control processes and the drive modes from the viewpoint of their function in the proximity exposure apparatus is as shown in Table 2.

TABLE 2

Correspondence between Control Processes and Drive Modes

| Control Process | Drive Mode |
| --- | --- |
| wafer receipt process | first drive mode |
| pre-alignment process | second drive mode |
| mask replacement process | first drive mode |
| mask alignment process | fifth drive mode |
| exposure shot positioning process | fifth drive mode |
| fine alignment process | fourth drive mode |
| wafer receipt process | first drive mode |

Then, the steps of the stage control method according to this embodiment will now be described with reference to an actual exposure sequence.

Since the method is the same as that of the stage control method according to the first embodiment of the present invention except the steps of: "setting of the mask alignment process"; "mask alignment"; "setting of the process for positioning the exposure shot position"; and "positioning of the exposure shot position", a description will be provided of only these differences.

(1) Setting of Mask Alignment Process

In order to set the control process to the mask alignment process, control process information $I_{CP}$ denoting the mask alignment process is supplied from the instruction unit 20 to the drive mode control unit 11. In the drive mode control unit 11, the drive mode is set to the fifth drive mode (see Table 2) corresponding to the mask alignment process (corresponding to step S18 shown in FIG. 4). All positioning drive operations are performed in the fifth drive mode until a next drive mode is set.

(2) Mask Alignment

The center of the wafer chuck 56 is positioned at the mask alignment position $Q_{MA}$ and the reference mark on the mask 2 is precisely positioned at the mask-axis stage reference 99 on the mirror 61 with which the laser interference meter measures the distance from the mirror 61 to the laser interference meter, in accordance with instructed position information $I_P$ (see FIG. 1) denoting the mask alignment position $Q_{MA}$ supplied from the instruction unit 20 to the drive mode control unit 11. Since the drive mode is set to the fifth drive mode at this time, drive shaft information $I_A$ denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_M$ denoting the Z-directional tilt shaft retraction drive operation performed via the major and fine movements along the X and Y axes drive method, and instructed position information $I_P$ denoting the mask alignment position $Q_{MA}$ are supplied from the drive mode control unit 11 to the drive control unit 12 so that the positioning operation is performed in accordance therewith. When the center of the wafer chuck 56 is positioned at the mask alignment position $Q_{MA}$, mask alignment is performed (corresponding to step S19 shown in FIG. 4).

(3) Setting of Process of Locating Exposure Shot Position

In order to set the control process to the process of positioning the exposure shot position, control process information $I_{CP}$ denoting the process of positioning the exposure shot position is supplied from the instruction unit 20 to the drive mode control unit 11. In the drive mode control unit 11, the drive mode is set to the fifth mode (see Table 2) corresponding to the process of positioning the exposure shot position (corresponding to step S20 shown in FIG. 4). All positioning operations are performed in the fifth drive mode until a next drive mode is set.

(4) Locating of Exposure Shot Position

In order to position the exposure shot position (for example, the first exposure shot position $Q_{S1}$ shown in FIG. 3) at the fine alignment position $Q_{FA}$, instructed position information $I_P$ (see FIG. 1) denoting the position of the center of the wafer chuck 56 when the first exposure shot position $Q_{S1}$ is positioned at the fine alignment position $Q_{FA}$ is supplied from the instruction unit 20 to the drive mode control unit 11. Since the drive mode is set to the fifth drive mode, drive shaft information IA denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_M$ denoting the Z-directional tilt shaft retraction drive operation performed via major and fine movements along the X and Y axes drive method, and the instructed position information $I_P$ denoting the center of the wafer chuck 56 are supplied from the drive mode control unit 11 to the drive control unit 12 so that the positioning operation is performed in accordance therewith (corresponding to step S21 shown in FIG. 4).

With the stage control method according to the first and second embodiments of the present invention, an error recovery process, an assembly adjustment process and a maintenance process are further provided using the first drive mode as shown in Table 3. As a result, even if precise positioning of the wafer chuck 56 cannot be performed due to occurrence of an error or the like in the laser interference meter, setting of the control method to the error recovery process causes the corresponding first drive mode to be set and thus the wafer chuck 56 can be positioned. Therefore, the wafer 1 and the mask 2 can be recovered. Even if the laser interference meter cannot be used in the assembly adjustment stage in the exposure apparatus, the wafer chuck 56 can be positioned similarly. Therefore, the assembly adjustment can easily be performed. Also the maintenance can easily be performed.

TABLE 3

Correspondence between Control Process and Drive Mode

| Control Process | Drive Mode |
| --- | --- |
| error recovery process | first drive mode |
| assembly adjustment process | first drive mode |
| maintenance process | first drive mode |

Third Embodiment

A third embodiment of the stage control method according to the present invention will now be described.

In an exposure apparatus, if the regions in which the instructed positioning operations are performed are different from each other or the regions overlap, only issuing instructed position information with instruction unit 20 enables an optimum drive mode to be selected automatically to perform the drive operation for driving the wafer chuck 56. For example, the present method can discriminate whether or not the amount of movement needed to move the wafer chuck 56 from the present position is within the stroke of the fine movement axis drive. This enables positioning of the exposure shot position and positioning of the fine alignment shot position to be distinguished from each other in the case where the positioning of the exposure shot position is performed. When the drive mode is determined in accordance with the amount of movement needed to move the wafer chuck 56 from the present position, the drive mode needed in a particular situation may be discriminated from another drive mode needing the wafer chuck 56 to perform a different amount of movement, as well as a mode requiring the use of the fine movement axis drive.

The correspondence among the instructed position, the amount of movement and the drive mode is as shown in Table 4.

TABLE 4

Correspondence between Instructed Position and Drive Mode

| Instructed Position | | Drive Mode |
|---|---|---|
| Exposure Shot Region | Amount of movement is within stroke of fine-movement axis drive operation | fourth drive mode |
| | Amount of movement exceeds stroke of fine-movement axis drive operation | third drive mode |
| Pre-alignment position | | second drive mode |
| Wafer Replacement Position | | first drive mode |
| Wafer chuck retracted position when mask is replaced | | first drive mode |
| Mask alignment position | | third drive mode |

Figure 5:
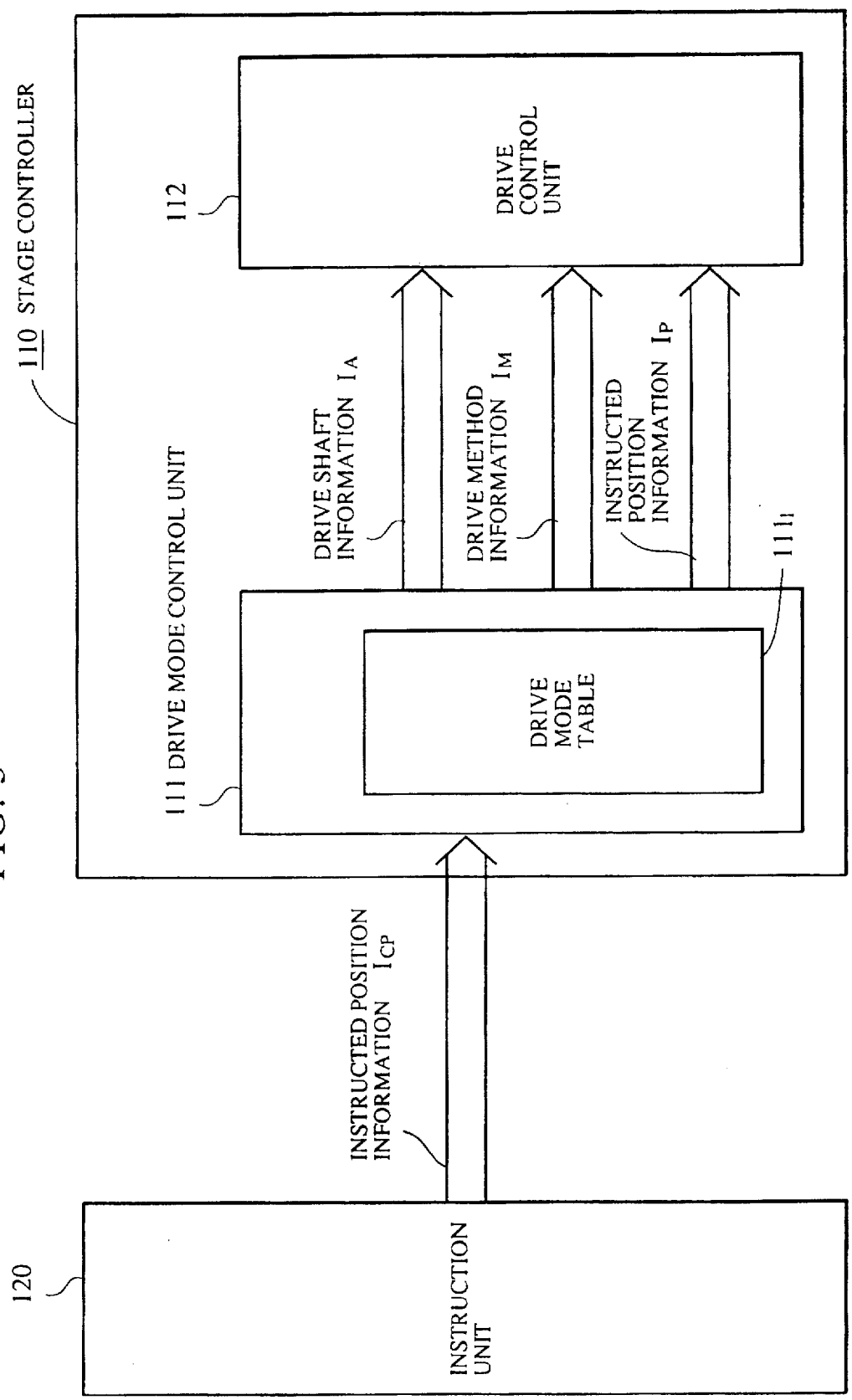
FIG. 5 is a block diagram which illustrates a stage controller in which another embodiment of a stage control method according to the present invention can be embodied.
Figure 6:
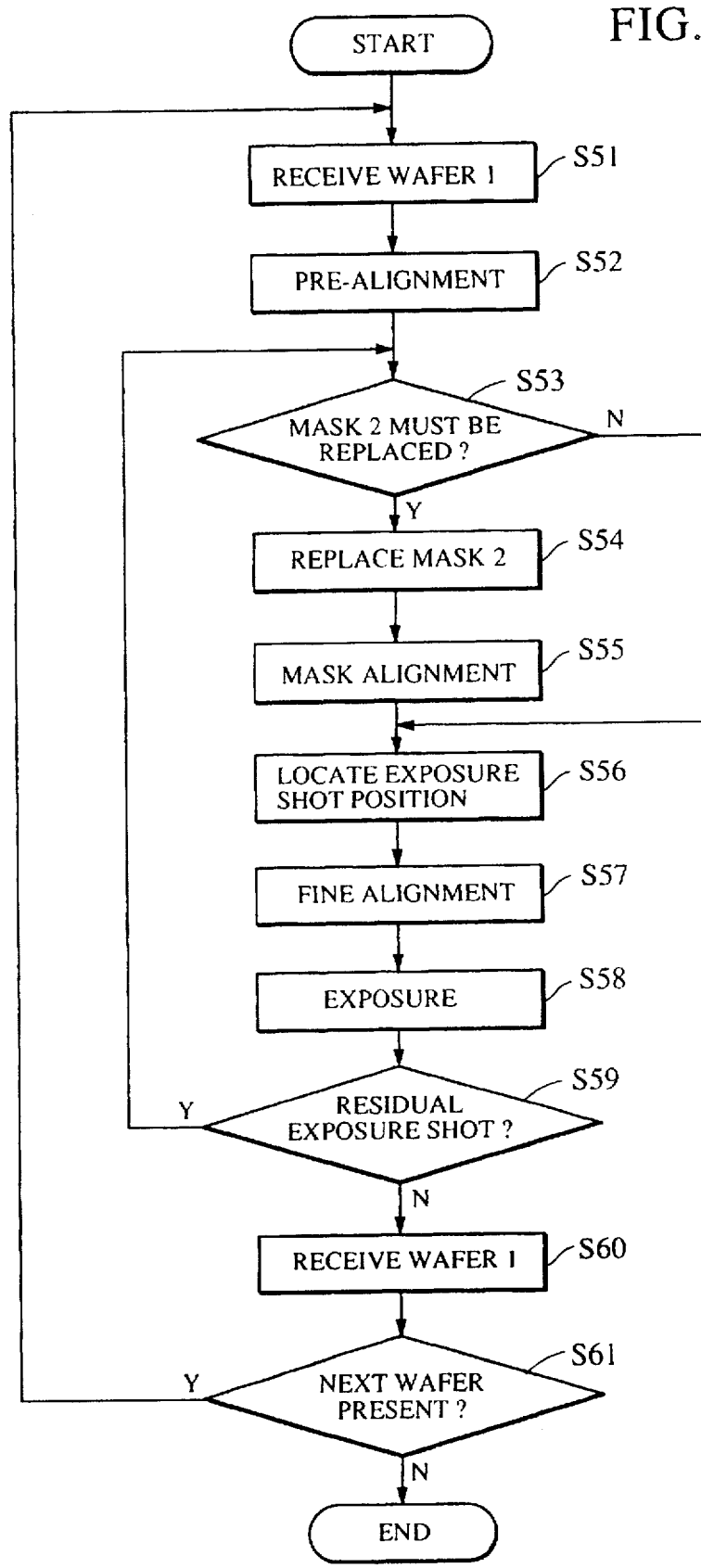
FIG. 6 is a flow chart of the control operation performed by the stage controller shown in FIG. 5.

This embodiment is shown in FIGS. 5 and 6. This instruction unit 120 shown in FIG. 5 differs from the instruction unit 20 shown in FIG. 1 in that the instruction unit 120 only supplies instructed position information $I_P$ to the drive mode control unit 111.

A stage controller 110 shown in FIG. 5, in which the stage control method according to this embodiment can be embodied differs from the stage controller 10 shown in FIG. 1 in that only instructed position information $I_P$ is supplied from the instruction unit 120 to the drive mode control unit 111 as shown in FIG. 5.

In the stage control method according to the present invention, instructed position information $I_P$ is supplied from the instruction unit 120 to the drive mode control unit 111. In the drive mode control unit 111, a drive mode corresponding to the thus supplied instructed position information $I_P$ is selected from Table 4 showing the correspondence between the instructed position and the drive mode so that the drive mode is set. In a case where the instructed position denoted by the thus supplied instructed position information $I_P$ is in the exposure shot region, the drive mode cannot be selected in accordance with only the instructed position. Therefore, the amount of movement of the wafer chuck 56 from its present position is used to select the drive mode. When the drive mode has been set as described above, drive shaft information $I_A$, drive method information $I_M$, and instructed position information $I_P$ corresponding to the present drive mode are supplied from the drive mode control unit 111 to the drive control unit 112 so that the positioning operation is performed. When the drive mode is set once, all positioning operations are performed in the present drive mode if the drive mode is not changed.

The stage control method according to this embodiment will now be described with reference to FIG. 6 in accordance with an actual exposure sequence. Since the structure of the stage portion and the stage positioning position are the same as those shown in FIGS. 2 and 3, the following description will be also provided with reference to FIGS. 2 and 3.

The wafer chuck 56 is positioned at the wafer replacement position $Q_U$ (see FIG. 3) and thus the wafer 1 is received from the wafer hand 70 in accordance with instructed position information $I_P$ (see FIG. 5) denoting the wafer replacement position $Q_U$ and supplied from the instruction unit 120 to the drive mode control unit 111. In the drive mode control unit 111, the drive mode is set to the first drive mode (see Table 4) corresponding to the wafer replacement position $Q_U$ because the thus supplied instructed position information $I_P$ denotes the wafer replacement position $Q_U$. As a result, drive shaft information $I_A$ denoting the X-directional major-movement shaft 51 and the Y-directional major-movement shaft 52, drive method information $I_M$ denoting the XY-directional major-movement drive method, and instructed position information $I_P$ denoting the wafer replacement position $Q_U$, are supplied from the drive mode control unit 111 to the drive control unit 112 so that the positioning operation is performed in accordance therewith. When the wafer chuck 56 has been positioned at the wafer replacement position $Q_U$, the wafer 1 is supplied from the wafer hand 70 to the wafer chuck 56 in a wafer receiving step (step S51).

Then, the wafer chuck 56 is positioned at the pre-alignment position $Q_{PA}$ (see FIG. 3) and thus positioning of the wafer 1 along the direction of rotation around the Z axis is performed in accordance with instructed position information $I_P$ (see FIG. 5) denoting the pre-alignment position $Q_{PA}$ and supplied from the instruction unit 120 to the drive mode control unit 111. In the drive mode control unit 111, the drive mode is set to the second drive mode (see Table 4) corresponding to the pre-alignment position $Q_{PA}$ because the thus-supplied instructed position information $I_P$ denotes the pre-alignment position $Q_{PA}$. As a result, drive shaft information $I_A$ denoting the X-directional major-movement shaft 51, the Y-directional major-movement shaft 52, the Y-directional fine-movement shaft 54 and the Z-directional tilt shaft 55, drive method information $I_M$ denoting the major movement along the X-axis and major and fine movements along the Y-axis drive method, and instructed position information $I_P$ denoting the pre-alignment position $Q_{PA}$ are supplied from the drive mode control unit 111 to the drive control unit 112 so that the positioning operation is performed in accordance therewith. When the wafer chuck 56 has been positioned at the pre-alignment position $Q_{PA}$, the wafer 1 is positioned along the direction around the Z axis in a pre-alignment step (step S52).

Then, whether or not the mask 2 must be replaced is discriminated (step S53). If a discrimination has been made that the replacement of the mask 2 is not required, the method proceeds to step S56 (positioning the exposure shot position) to be described later.

If a discrimination has been made in step S53 that the replacement of the mask 2 is required, the wafer chuck 56 is positioned at the wafer chuck retracting position $Q_E$ (see FIG. 3) to replace the mask 2 in accordance with instructed position information $I_P$ (see FIG. 5) denoting the wafer chuck retracting position $Q_E$ and supplied from the instruction unit 120 to the drive mode control unit 111. Since the thus supplied instructed position information $I_P$ denotes the wafer chuck retracting position $Q_E$, the drive mode is, in the drive mode control unit 111, set to the first drive mode (see Table 4) corresponding to the wafer chuck retracting position $Q_E$. As a result, drive shaft information $I_A$ denoting the X-directional major-movement shaft 51 and the Y-directional major-movement shaft 52, drive method information $I_M$ denoting the XY-directional major-movement drive method, and instructed position information $I_P$ denoting the wafer chuck retracting position $Q_E$ are supplied from the drive mode control unit 111 to the drive control unit 112 so that the positioning operation is performed in accordance therewith. When the wafer chuck 56 has been positioned at the wafer chuck retracting position $Q_E$, the mask 2 is replaced (step S54).

Then, the center of the wafer chuck 56 is positioned at the mask alignment position $Q_{MA}$ and thus the reference mark on the mask 2 is precisely positioned at the mask-axis stage reference 99 on the mirror 61 with which the laser interference meter measures the distance from the mirror 61 to the laser interference meter in accordance with instructed position information $I_P$ (see FIG. 5) denoting the mask alignment position $Q_{MA}$ and supplied from the instruction unit 120 to the drive mode control unit 111. Since the thus-supplied instructed position information $I_P$ denotes the mask alignment position $Q_{MA}$, the drive mode is, in the drive mode control unit 111, set to the third drive mode (see Table 4) corresponding to the mask alignment position $Q_{MA}$. As a result, drive shaft information $I_A$ denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_m$ denoting the major and fine movements of X and Y axes drive method, and the instructed position information $I_P$ denoting the mask alignment position $Q_{MA}$ are supplied from the drive mode control unit 111 to the drive control unit 112 so that the positioning operation is performed in accordance therewith. When the center of the wafer chuck 56 has been positioned at the mask alignment position $Q_{MA}$, mask alignment is performed (step S55).

Then, the present exposure shot position (for example, the first exposure shot position $Q_{S1}$ shown in FIG. 3) is positioned at the fine alignment position $Q_{FA}$ in accordance with instructed position information $I_P$ (see FIG. 5) denoting the center of the wafer chuck 56 when the first exposure shot position $Q_{S1}$ is positioned at the fine alignment position $Q_{FA}$ and supplied from the instruction unit 120 to the drive mode control unit 111. In the drive mode control unit 111, the thus-supplied instructed position information $I_P$ denotes the instructed position in the exposure shot region and because the amount of movement needed for the wafer chuck 56 to perform exceeds the stroke of the X-directional fine-movement shaft 53 and the Y-directional fine-movement shaft 54, the drive mode is set to the third drive mode (see Table 4) corresponding to the foregoing fact. As a result, drive shaft information $I_A$ denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_M$ denoting the major and fine movements of X and Y axes drive method, and instructed position information $I_P$ denoting the position of the center of the wafer chuck 56, are supplied from the drive mode control unit 111 to the drive control unit 112 so that the positioning operation is performed in accordance therewith in a position exposure shot position step (step S56).

In order to precisely position the present exposure position for example, the first exposure shot position $Q_{S1}$ shown in FIG. 3 and the exposure pattern P of the mask 2 are precisely positioned with respect to each other, and the amount of deviation between the first exposure shot position $Q_{S1}$ and the exposure pattern P of the mask 2 is measured. Instructed position information $I_P$ (see FIG. 1) corrected in accordance with the measured amount of deviation and denoting the center of the wafer chuck 56 is supplied from the instruction unit 120 to the drive mode control unit 111. Since the instructed position is in the exposure shot region and the amount of movement is within the stroke of the X-directional fine-movement shaft 53 and the Y-directional fine-movement shaft 54, the drive mode is, in the drive mode control unit 111, set to the fourth drive mode (see Table 4) corresponding to the foregoing fact. As a result, drive shaft information $I_A$ denoting the X-directional fine-movement shaft 53 and the Y-directional fine-movement shaft 54, drive method information $I_M$ denoting the fine-movement XY-axes drive method, and instructed position information $I_P$ denoting the position of the center of the wafer chuck 56 are supplied from the drive mode control unit 111 to the drive control unit 112 so that the positioning operation is performed in accordance therewith in a fine alignment step (step S57).

Then, exposure is performed (step S58), and whether or not a residual exposure shot is present is discriminated (step S59). If a discrimination has been made that the residual shot is present, the method returns to step S53 (in which whether or not the mask 2 must be replaced is discriminated).

If a discrimination has been made in step S59 that there is no residual exposure shot, the wafer chuck 56 is positioned at the wafer replacement position $Q_U$ (see FIG. 3) to send the wafer 1 to the wafer hand 70 in accordance with instructed position information $I_P$ (see FIG. 5) denoting the wafer replacement position $Q_U$ and supplied from the instruction unit 120 to the drive mode control unit 111. In the drive mode control unit 111, the drive mode is set to the first drive mode (see Table 4) corresponding to the wafer replacement position $Q_U$, since the thus-supplied instructed position information $I_P$ denotes the wafer replacement position $Q_U$. As a result, drive shaft information $I_A$ denoting the X-directional major-movement shaft 51 and the Y-directional major-movement shaft 52, drive method information $I_M$ denoting the XY-directional major-movement drive method, and instructed position information $I_P$ denoting the wafer replacement position $Q_U$ are supplied from the drive mode control unit 111 to the drive control unit 112 so that the positioning operation is performed in accordance therewith. When the wafer chuck 56 has been positioned at the wafer replacement position $Q_U$, the wafer 1 is sent from the wafer chuck 56 to the wafer hand 70 in a wafer receiving step (step S60).

Then, whether or not a next wafer (a wafer to be exposed to light) is present is discriminated (step S61). If a next wafer is present, the method returns to step S51 (receipt of the wafer 1). If the next wafer is not present, the operation is completed here.

A fourth embodiment of the stage control method according to the present invention will now be described.

The stage control method according to this embodiment is adapted to a proximity exposure apparatus for exposing the wafer to light in a state where the mask and the wafer are near (that is, the distance from the mask to the wafer is of the order of tens of micrometers). Since the structure of the stage portion and the position to which the wafer chuck is positioned are the same as those shown in FIGS. 2 and 3, this embodiment will now be described with reference to FIGS. 2 and 3.

As described above, when positioning is performed in the exposure shot region A by using the X-directional major-movement shaft 51 and the Y-directional major-movement shaft 52 of the proximity exposure apparatus, the interference between the mask 2 and the wafer 1 is prevented by retracting the Z-directional tilt shaft 55 when the X-directional major-movement shaft 51 and the Y-directional major-movement shaft 52 are driven. As a result, safety of the mask 2 and wafer 1 can be secured.

The correspondence in the proximity exposure apparatus among the instructed position, the amount of movement from the present position and the drive mode is as follows:

TABLE 5

Correspondence between Instructed Position and Drive Mode

| Instructed Position | Drive Mode |
| --- | --- |
| Exposure Shot Region — Amount of movement is within stroke of fine-movement axis drive operation | fourth drive mode |
| Exposure Shot Region — Amount of movement exceeds stroke of fine-movement axis drive operation | fifth drive mode |
| Pre-alignment position | second drive mode |
| Wafer Replacement Position | first drive mode |
| Wafer chuck retracted position when mask is replaced | first drive mode |
| Mask alignment position | fifth drive mode |

The stage control method according to this embodiment will now be described with reference to an actual exposure sequence.

Since this method is the same as that of the stage control method according to the third embodiment of the present invention except for the steps of "mask alignment" and "positioning the exposure shot position", only these differences will be described.

(1) Mask Alignment

The center of the wafer chuck 56 is positioned at the mask alignment position $Q_{MA}$ and thus the reference mark on the mask 2 is positioned at the mask-axis stage reference 99 on the mirror 61 with which the laser interference meter measures the distance from the mirror 61 to the laser interference meter in accordance with instructed position information $I_P$ (see FIG. 5) denoting the mask alignment position $Q_{MA}$ and supplied from the instruction unit 120 to the drive mode control unit 111. In the mask alignment position $Q_{MA}$, the drive mode is set to the fifth drive mode (see Table 5) corresponding to the mask alignment position $Q_{MA}$ because the thus-supplied instructed position information $I_P$ denotes the mask alignment position $Q_{MA}$. As a result, drive shaft information $I_A$ denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_M$ denoting the Z-directional tilt shaft retraction drive operation performed by major and fine movements along the X and Y axes drive method, and instructed position information $I_P$ denoting the mask alignment position $Q_{MA}$ are supplied from the drive mode control unit 111 to the drive control unit 112 so that the positioning operation is performed in accordance therewith. When the center of the wafer chuck 56 has been positioned at the mask alignment position $Q_{MA}$, mask alignment is performed (corresponding to step S55 shown in FIG. 6).

(2) Locating Exposure Shot Position

In order to position the present exposure shot position (for example, the first exposure shot position $Q_{S1}$ shown in FIG. 3) at the fine alignment position $Q_{FA}$, instructed position information $I_P$ (see FIG. 5) denoting the position of the center of the wafer chuck 56 when the first exposure shot position $Q_{S1}$ is positioned at to the fine alignment position $Q_{FA}$ is supplied from the instruction unit 120 to the drive mode control unit 111. Since the instructed position is in the exposure shot region and the amount of movement exceeds the stroke of the X-directional fine-movement shaft 53 and the Y-directional fine-movement shaft 54, the drive mode is, in the drive mode control unit 111, set to the fifth drive mode (see Table 5) corresponding to the foregoing fact. As a result, drive shaft information $I_A$ denoting the X-directional major-movement shaft 51, the Y-directional major-movement shaft 52, the X-directional fine-movement shaft 53, the Y-directional fine-movement shaft 54 and the Z-directional tilt shaft 55, drive method information $I_M$ denoting the Z-directional tilt shaft retraction drive operation performed by major and fine movements along the X and Y axes drive method, and instructed position information $I_P$ denoting the position of the center of the wafer chuck 56 are supplied from the drive mode control unit 111 to the drive control unit 112 so that the positioning operation is performed in accordance therewith (corresponding to step S56 shown in FIG. 6).

Although the invention has been described in its preferred form with a certain degree of particularly, it is understood that the present disclosure of the preferred form can be changed in the details of construction and the combination and arrangement of parts may be modified to without departing from the spirit and the scope of the invention as hereinafter claimed.

What is claimed is:

1. A method of controlling a movable stage including an X-directional major-movement stage mechanism, a Y-directional major-movement stage mechanism, an X-directional minor-movement stage mechanism, a Y-directional minor-movement stage mechanism, and a Z-directional tilt stage mechanism, said method comprising the steps of:

setting a plurality of processes in an exposure apparatus, in response to the inputting of an instruction to perform the plurality of processes, selected from the following groups of processes: a) a wafer receipt process, b) a pre-alignment process, c) a mask replacement process, d) a mask alignment process, e) an exposure shot positioning process, and f) a fine alignment process;

setting a plurality of drive modes for driving various combinations of the stage mechanisms to perform the plurality of processes in the exposure apparatus, each drive mode corresponding to one of said plurality of set processes, each drive mode operating some combination of said stage mechanisms;

storing data associating each of the plurality of processes to be performed in the exposure apparatus with one of the drive modes driving a combination of the stage mechanisms and instructing any of the plurality of processes that are set, to be performed in the exposure apparatus in accordance with its associated drive mode by driving a combination of the stage mechanisms;

calculating the amount of positional change of a stage mechanism that occurs when the other stage mechanisms are driven along their respective axes prior to the performing of any of the plurality of processes in the exposure apparatus; and performing a particular set process by driving the combination of stage mechanisms specified by the drive mode corresponding to the particular set process in accordance with the data stored in the storing step and the calculating performed in the calculating step.

2. An exposure apparatus comprising:

a stage mechanism on which a substrate is being held, said stage mechanism comprising an X-directional major-movement stage, a Y-directional major-movement stage, an X-directional minor-movement stage, a Y-directional minor-movement stage, and a Z-directional tilt stage;

means for exposing the substrate with radiation energy; and a controller for driving said stage mechanism comprising:

means for setting a plurality of processes in response to the inputting of an instruction to perform the plurality of processes selected from the following groups of processes: a) a wafer receipt process, b) a pre-alignment process, c) a mask replacement process, d) a mask alignment process, e) an exposure shot positioning process, and f) a fine alignment process;

means for setting a plurality of drive modes for driving various combinations of the stages to perform the plurality of processes in said exposure apparatus, each corresponding to one of said set processes, each drive mode operating some combination of stages;

means for storing data associating each of the plurality of processes to be performed in said exposure apparatus with one of the drive modes driving a combination of the stages;

means for instructing any of the plurality of processes that are set, to be performed in said exposure apparatus in accordance with its associated drive mode by driving a combination of the stages;

means for calculating the amount of positional change of a stage that occurs when the other stages are driven along their respective axes prior to the performing of any of the plurality of processes in said exposure apparatus;

means for performing a particular set process by driving the combination of stages specified by the drive mode corresponding to the particular set process in accordance with the data stored in said storing means and the calculating performed by said calculating means and in response to the instructing of said instruction means.

3. A method of controlling a movable stage comprising an X-directional major-movement stage mechanism, a Y-directional major-movement stage mechanism, an X-directional minor-movement stage mechanism, a Y-directional minor-movement stage mechanism, and a Z-directional tilt stage mechanism, said method comprising the steps of:

inputting a plurality of target positions in an exposure apparatus, selected from the following groups of positions: a) a position in an exposure shot region, b) a pre-alignment position, c) a wafer replacement position, d) a wafer chuck retracted position, and e) a mask alignment position;

setting a plurality of drive modes for driving the various combinations of the stage mechanisms so that the stage is driven to the input target positions, each drive mode corresponding to one of said input plurality of target positions, each drive mode operating some combination of the stage mechanisms;

storing data associating each of the plurality of target positions with one of the drive modes driving some combination of the stage mechanisms and instructing the stage to move to any of the target positions that are input, in accordance with their associated drive mode by driving a particular combination of the stage mechanisms;

calculating the amount of positional change of a stage mechanism that occurs when the other stage mechanisms are driven along their respective axes prior to the driving of the stage to an input target position; and driving the stage to a particular input target position by driving the combination of stage mechanisms specified by the drive mode corresponding to the particular input target position in accordance with the data stored in the storing step and the calculating performed in the calculating step.

4. An exposure apparatus comprising:

a stage mechanism on which a substrate is being held, said stage mechanism comprising an X-directional major-movement stage, a Y-directional major-movement stage, an X-directional minor-movement stage, a Y-directional minor-movement stage, and a Z-directional tilt stage;

means for exposing the substrate with radiation energy; and a controller for driving said stage mechanism comprising:

means for inputting a plurality of target positions selected from the following groups of positions: a) a position in an exposure shot region, b) a pre-alignment position, c) a wafer replacement position, d) a wafer chuck position when mask is replaced, and e) a mask alignment position;

means for setting a plurality of drive modes for driving various combinations of the stages to drive the stage mechanism to input target positions, each drive mode being set in response to the inputting of a particular corresponding target position and each drive mode operating some combination of stages;

means for storing data associating each of the plurality of input target positions with one of the drive modes driving a combination of said stages;

means for instructing said stage mechanism to move to any input target position in accordance with its associated drive mode by driving a combination of said stages;

means for calculating the amount of positional change of a stage that occurs when the other stages are driven along their respective axes prior to the driving of said stage mechanism to an input target position; and means for driving said stage mechanism to a particular input target position by driving the combination of stages specified by the drive mode corresponding to the particular input target position in accordance with the data stored in said storing means and the calculating performed by said calculating means in response to the instructing performed by said instructing means.

5. A method of controlling a movable stage, according to claim 1, wherein the number of drive modes is less than the number of processes.

6. An exposure apparatus according to claim 2, wherein the number of drive modes is less than the number of processes.

7. A method of controlling a movable stage, according to claim 3, wherein the number of drive modes is less than the number of target positions.

8. An exposure apparatus according to claim 4, wherein the number of drive modes is less than the number of target positions.

9. An exposure apparatus comprising:

a stage mechanism on which a wafer is being held;

means for exposing the wafer with radiation energy; and a controller for driving said stage mechanism comprising:

means for setting one of (1) a plurality of processes in the exposure apparatus selected from the following processes: a) a wafer receipt process, b) a pre-alignment process, c) a mask replacement process, d) an exposure shot positioning process, and e) a fine alignment process, and (2) a plurality of target positions selected from the following positions: a) a position in an exposure shot region, b) a pre-alignment position, c) a wafer replacement position, and d) a fine-alignment position;

means for setting a plurality of drive modes for driving said stage mechanism to the plurality of target positions and for driving said stage mechanism to perform the plurality of processes, each drive mode corresponding to one of said set plurality of processes or target positions;

means for storing data associating each of the plurality of processes to be performed in the exposure apparatus and for associating each of the target positions with one of the drive modes, instructing said stage mechanism to be driven to perform any of said plurality of processes that are set in accordance with its associated drive mode, and instructing said stage mechanism to be driven to any of said target positions that are input in accordance with its associated drive mode;

wherein said stage mechanism is drivable along a plurality of axes, wherein driving of said stage mechanism along one axis changes the position of said stage mechanism along another axis, means for calculating the amount of positional change of said stage mechanism that occurs along the another axis when said stage mechanism is driven along the one axis prior to the performing of any of the set plurality of processes in the exposure apparatus and prior to driving said stage mechanism to any of the set target positions, and wherein the positional change comprises at least one of i) a change in the attitude of said stage mechanism, ii) an abbe error of said stage mechanism, and iii) a change about X and Y axes of major-movement of said stage mechanism, and means for driving said stage mechanism to perform any one of the plurality of processes that are set in a drive mode corresponding to the set process in accordance with the data stored by said storing means, and in accordance with the calculating performed by said calculating means if the drive mode corresponding to the set process corrects the positional change along the another axis, and for driving said stage mechanism to any one of the target positions that are set in a drive mode corresponding to the set target position in accordance with the data stored in said storing means, and in accordance with the calculating performed by said calculating means if the drive mode corresponding to the set target position corrects the positional change along the another axis.

10. An exposure apparatus according to claim 9, wherein said stage mechanism comprises a major-movement mechanism and a minor-movement mechanism, and said stage mechanism is driven by using one of or both of said major-movement and minor-movement mechanism.

11. An exposure apparatus according to claim 9, wherein the number of drive modes is less than the number of the target positions.

12. An exposure apparatus comprising:

a stage mechanism on which a wafer is being held;

means for exposing the wafer with radiation energy;

first measuring means for measuring positional information of said stage mechanism in a predetermined direction;

second measuring means for measuring positional information of said stage mechanism in the predetermined direction;

a controller for driving said stage mechanism comprising:

means for setting one of (1) a plurality of processes in the exposure apparatus selected from the following processes: a) a wafer receipt process, b) a pre-alignment process, c) a mask replacement process, d) an exposure shot positioning process, and e) a fine alignment process, and (2) a plurality of target positions selected from the following positions: a) a position in an exposure shot region, b) a pre-alignment position, c) a wafer replacement position, and d) a fine-alignment position;

means for setting a plurality of drive modes for driving said stage mechanism, each corresponding to one of said set plurality of processes or target positions, wherein said drive modes comprise a first drive mode in which said stage mechanism is driven by using said first measuring means and a second drive mode in which said stage mechanism is driven by using said second measuring means;

means for storing data associating each of the plurality of processes to be performed in the exposure apparatus and for associating each of the target positions with one of the drive modes, instructing said stage mechanism to be driven to perform any of said plurality of processes that are set in accordance with its associated drive mode, and instructing said stage mechanism to be driven to any of said target positions that are set in accordance with its associated drive mode;

means for calculating the amount of positional change of said stage mechanism that occurs along one axis when said stage mechanism is driven along another axis prior to the performing of any of the plurality of set processes in the exposure apparatus and prior to driving said stage mechanism to any of the set target positions; and means for driving said stage mechanism to perform any one of the plurality of processes that are set in a drive mode corresponding to the set process in accordance with the data stored by said storing means, and in accordance with the calculating performed by said calculating means if the drive mode corresponding to the set process corrects the positional change, and for driving said stage mechanism to any one of the target positions that are set in a drive mode corresponding to the set target position in accordance with the data stored in said storing means, and in accordance with the calculating performed by said calculating means if the drive mode corresponding to the set target position corrects the positional change along the another axis.

13. An exposure apparatus according to claim 12, wherein said first measuring means comprises an encoder or an optical scale, and said second measuring means comprises a laser interferometer.

14. An exposure apparatus according to claim 12, wherein said stage mechanism comprises a major-movement mechanism and a minor-movement mechanism, and said stage mechanism is driven by using one of or both of said major-movement and minor-movement mechanism.

15. An exposure apparatus according to claim 12, wherein the number of drive modes is less than the number of the target positions.

* * * * *

UNITED STATES PATENT AND TRADEMARK OFFICE
CERTIFICATE OF CORRECTION

PATENT NO. : 5,760,561
DATED : June 2, 1998
INVENTOR(S) : HIDEYUKI CHINJU, ET AL.

It is certified that error appears in the above-identified patent and that said Letters Patent is hereby corrected as shown below:

COLUMN 25:

Line 57, "mechanism" should read --mechanisms--.

COLUMN 26:

Line 62, "mechanism" should read --mechanisms--.

Signed and Sealed this

Eighth Day of June, 1999

Attest:

Q. TODD DICKINSON

*Attesting Officer*     *Acting Commissioner of Patents and Trademarks*